(12) United States Patent
Zhang

(10) Patent No.: US 8,808,024 B2
(45) Date of Patent: Aug. 19, 2014

(54) ELECTRICAL CONNECTOR HAVING POSITION FIXER FOR CONDUCTIVE TERMINALS

(71) Applicant: Zhi-Cheng Zhang, Kunshan (CN)

(72) Inventor: Zhi-Cheng Zhang, Kunshan (CN)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 30 days.

(21) Appl. No.: 13/730,863

(22) Filed: Dec. 29, 2012

(65) Prior Publication Data

US 2013/0252457 A1 Sep. 26, 2013

(30) Foreign Application Priority Data

Mar. 23, 2012 (CN) .......................... 2012 1 0079513

(51) Int. Cl.
*H01R 13/64* (2006.01)
(52) U.S. Cl.
USPC ........................................................ 439/377
(58) Field of Classification Search
USPC ........... 439/377, 620.06, 620.05, 541.5, 76.2, 439/79, 95
See application file for complete search history.

(56) References Cited

U.S. PATENT DOCUMENTS

| 6,227,911 | B1 * | 5/2001 | Boutros et al. | 439/620.18 |
| 6,585,540 | B2 | 7/2003 | Gutierrez et al. | |
| 6,733,306 | B2 | 5/2004 | Kane et al. | |
| 6,840,817 | B2 | 1/2005 | Chen | |
| 7,261,592 | B2 * | 8/2007 | Korsunsky et al. | 439/541.5 |
| 7,717,749 | B2 * | 5/2010 | Chen et al. | 439/620.22 |
| 7,959,473 | B2 * | 6/2011 | Machado et al. | 439/676 |
| 8,480,440 | B2 * | 7/2013 | Machado et al. | 439/676 |

FOREIGN PATENT DOCUMENTS

CN            201498790            6/2010

\* cited by examiner

*Primary Examiner* — Jean F Duverne
(74) *Attorney, Agent, or Firm* — Wei Te Chung; Ming Chieh Chang

(57) ABSTRACT

An electrical connector (10) adapted for being mounted onto a printed circuit board (PCB) including a number of vias. The electrical connector includes an insulative housing (200) having a board mounting surface (12), a contact module (400) assembled to the insulating housing (200) and including a number of conductive terminals (403), and a positioning fixer (300) mounting to the conductive terminals. Each of the conductive terminals includes a pin end extending beyond the mounting surface for being inserted into one of the PCB vias. The position fixer (300) has a plurality of through holes (301) each retaining to a corresponding pin end (405) prior to the position fixer (300) being moved up to the mounting surface when the electrical connector is mounted to the PCB.

16 Claims, 8 Drawing Sheets

ELECTRICAL CONNECTOR HAVING POSITION FIXER FOR CONDUCTIVE TERMINALS

BACKGROUND OF THE INVENTION

1. Field of the invention

The present invention relates to an electrical connector and method of making the same, and more particularly to an electrical connector suitable for high-speed communication.

2. Description of Related Art

Chinese Patent No. 201498790 issued on Jun. 2, 2010 discloses a related art. According to the disclosure, an electrical connector adapted for being mounted onto a printed circuit boards includes an insulative housing and a plurality of conductive terminals received in the insulative housing. The insulative housing has a mounting surface. The conductive terminals extend through the mounting surface to solder on the printed circuit board. Because of the electrical connector has a large number conductive terminals, it is not easy to lead all of the conductive terminals solder into the printed circuit board accurately.

U.S. Pat. No. 6,840,817 issued on Jan. 11, 2005 and U.S. Pat. No. 6,585,540 issued on Jul. 1, 2003 both disclose a related art. According to the disclosure, an electrical connector adapted for being mounted onto a printed circuit board includes an insulative housing having a bottom mounting surface, a bottom shield substrate having a plurality of through holes or vias and mounted onto the bottom mounting surface of the insulative housing, and a plurality of conductive terminals extending through the substrate through holes or vias. While the shield substrate provides certain secondary mechanical functions including pin fastening, spacing and alignment, and/or mechanical support and positional registration, the length of the conductive terminals extending outside of the shield substrate is still relatively long. Therefore, when the electrical connector is mounted onto the printed circuit board, an exterior part of the conductive terminals may still be apt to bend such that it is difficult to insert the conductive terminals into the printed circuit board.

U.S. Pat. No. 6,733,306 issued on May 11, 2004 discloses a related art. According to the disclosure, an electrical connector adapted for being mounted onto a printed circuit board includes an insulative housing having a mounting surface, a spacer having a plurality of through holes, and a plurality of conductive terminals inserted into the through holes of the spacer. In this design, the conductive terminals and the spacer are kept at a stationary positional relationship such that there is always a relatively long length of the terminal exposed outside of the spacer, which may subject to bending by external forces.

Hence, an improved electrical connector is required to overcome the above-mentioned disadvantages of the related art.

SUMMARY OF THE INVENTION

Accordingly, an object of the present invention is to maintain a positional relationship between a plurality of conductive terminals of an electrical connector and vias of a printed circuit board for ease of inserting the terminals into the vias.

In order to achieve the above-mentioned object, the present invention provides an electrical connector adapted for being mounted onto a printed circuit board which defining a plurality of vias, said electrical connector includes an insulative housing having a mounting surface adapted for being mounted onto the printed circuit board and a contact module assembled to the insulative housing. The contact module includes a plurality of conductive terminals, each of the conductive terminals has a pin end extending beyond the mounting surface for being inserted into a correspondence via. The electrical connector further includes a position fixer each retaining to a corresponding pin end prior to the position fixer being moved up to the mounting surface when the electrical connector is mounted to the printed circuit board.

In order to achieve the above-mentioned object, the invention provides a method of mounting an electrical connector having a housing and a plurality of conductive terminals to a printed circuit board having a plurality of vias, the method comprising the steps of:

retaining a position fixer defining a plurality of through holes corresponding to the conductive terminals to pin ends of the conductive terminals; and inserting the pin ends into the vias while moving the position fixer all the way up to the housing.

The position fixer maintains a stable positional relationship among the conductive terminals. The position fixer is effective to ensure all of the conductive terminals be inserted into the printed circuit board, thus reducing damage of the product.

Other objects, advantages and novel features of the invention will become more apparent from the following detailed description when taken in conjunction with the accompanying drawings.

DETAILED DESCRIPTION OF THE PREFERRED EMBODIMENT

Figure 1:
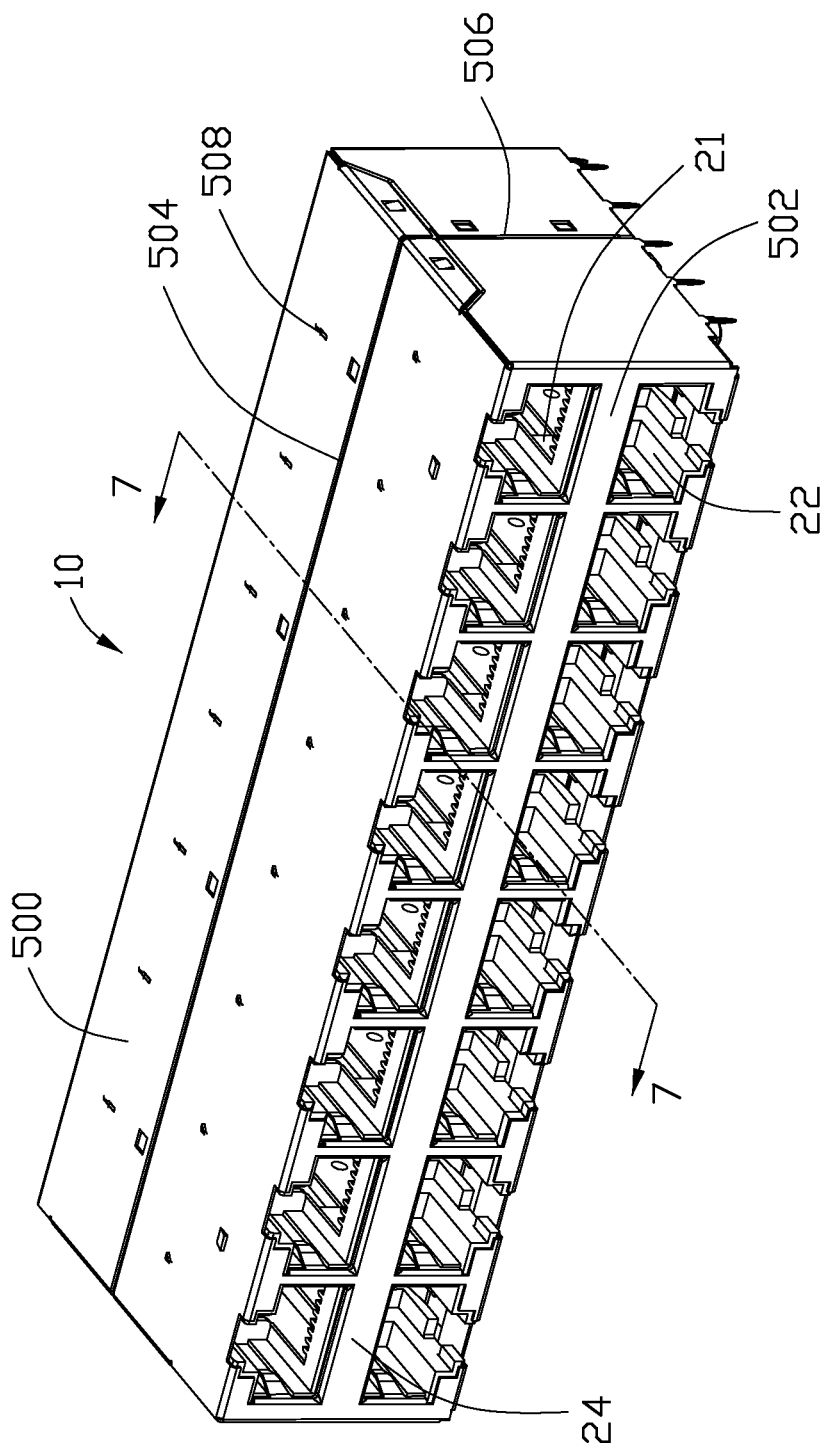
FIG. 1 is a perspective view of an electrical connector in accordance with the present invention.
Figure 2:
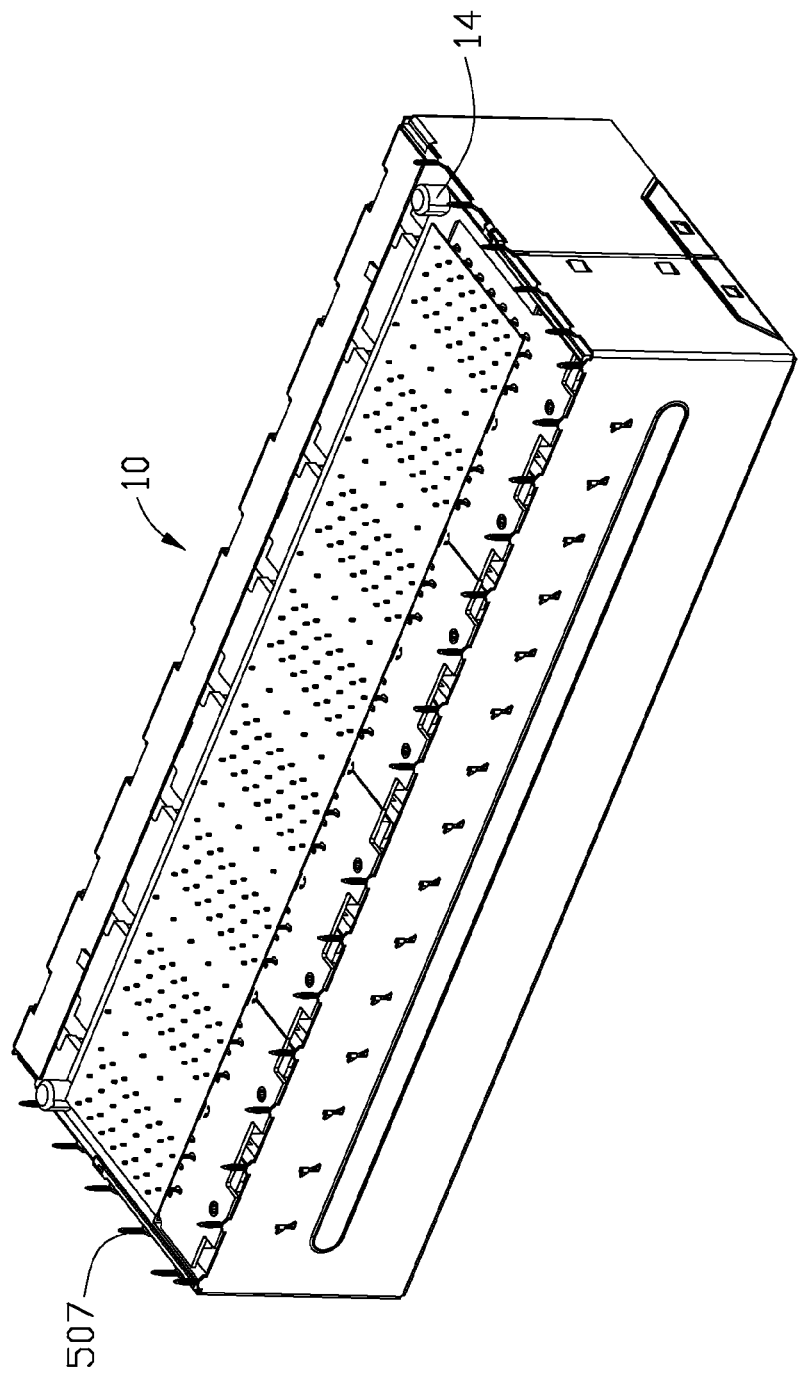
FIG. 2 is another perspective view of the electrical connector as shown in FIG. 1.
Figure 3:
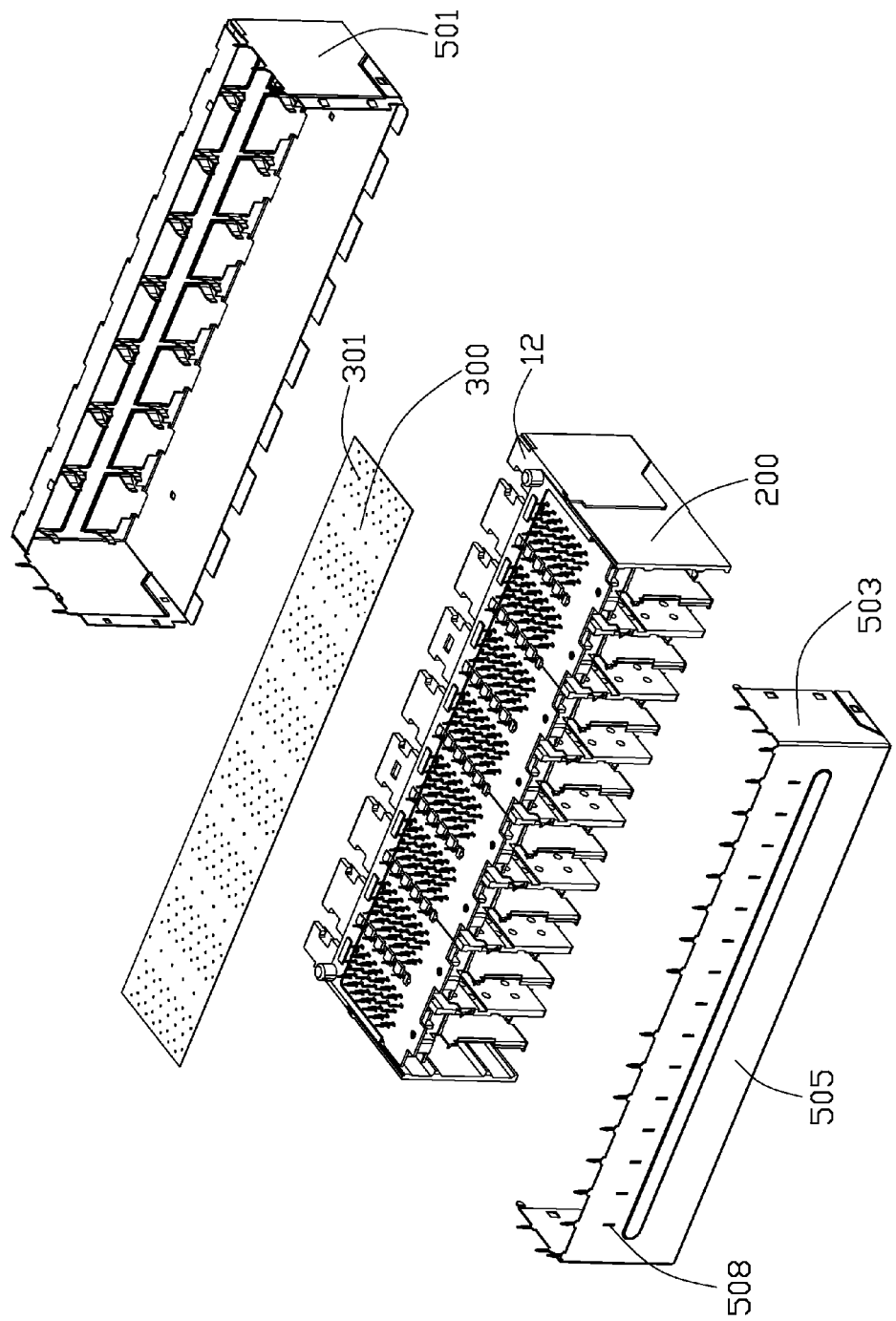
FIG. 3 is an exploded view of the electrical connector as shown in FIG. 2.
Figure 4:
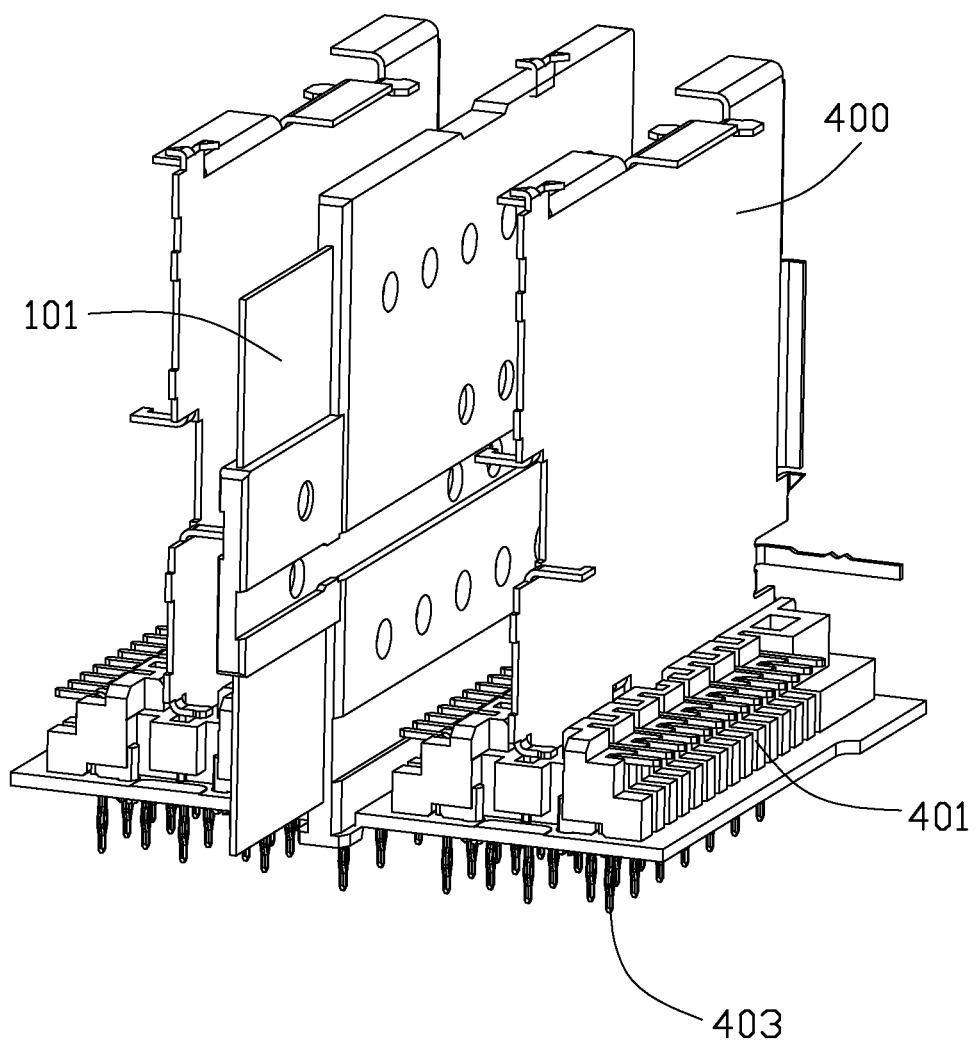
FIG. 4 is a perspective view of the contact module of the electrical connector as shown in FIG. 1.
Figure 5:
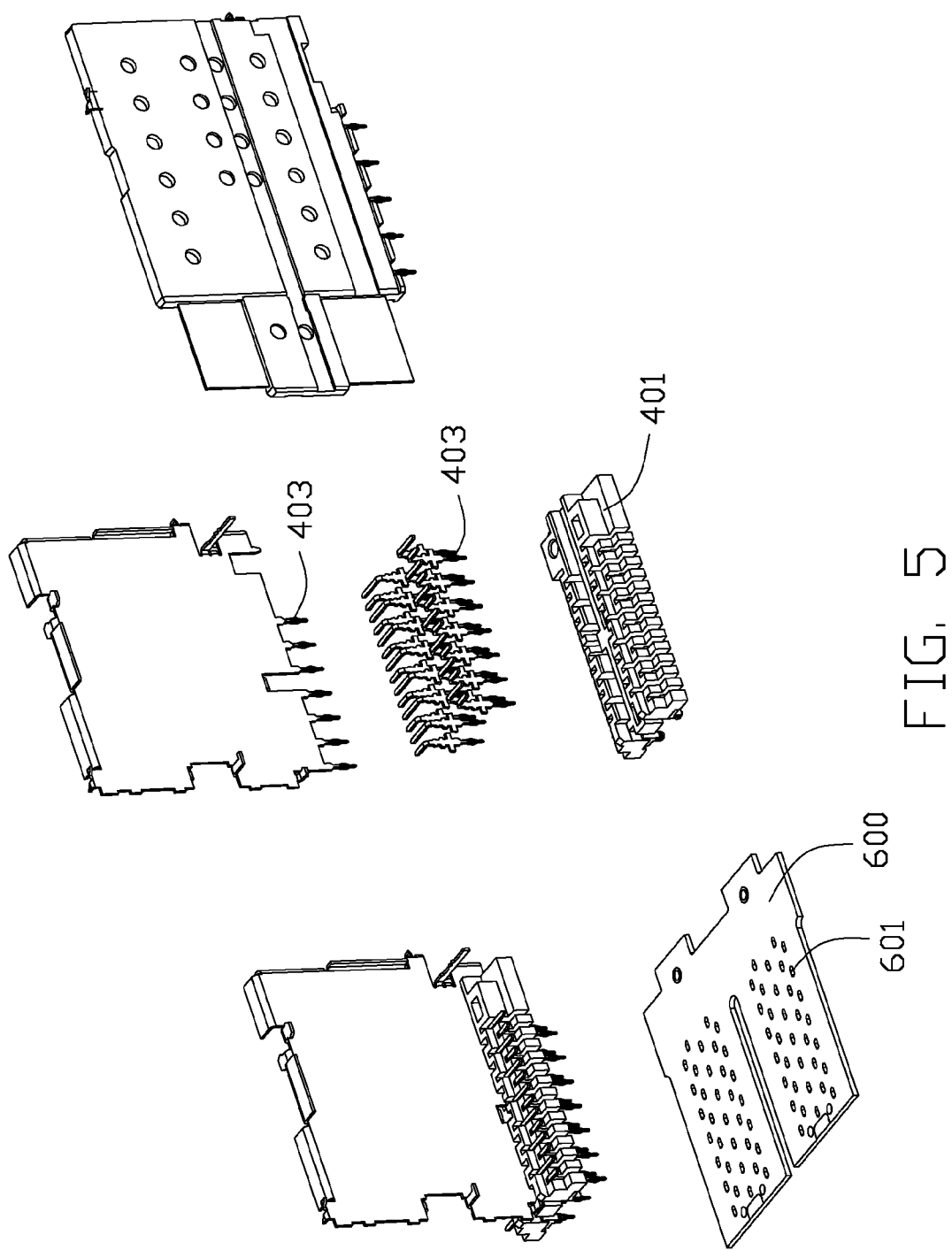
FIG. 5 is an exploded view of the contact module as shown in FIG. 4.
Figure 6:
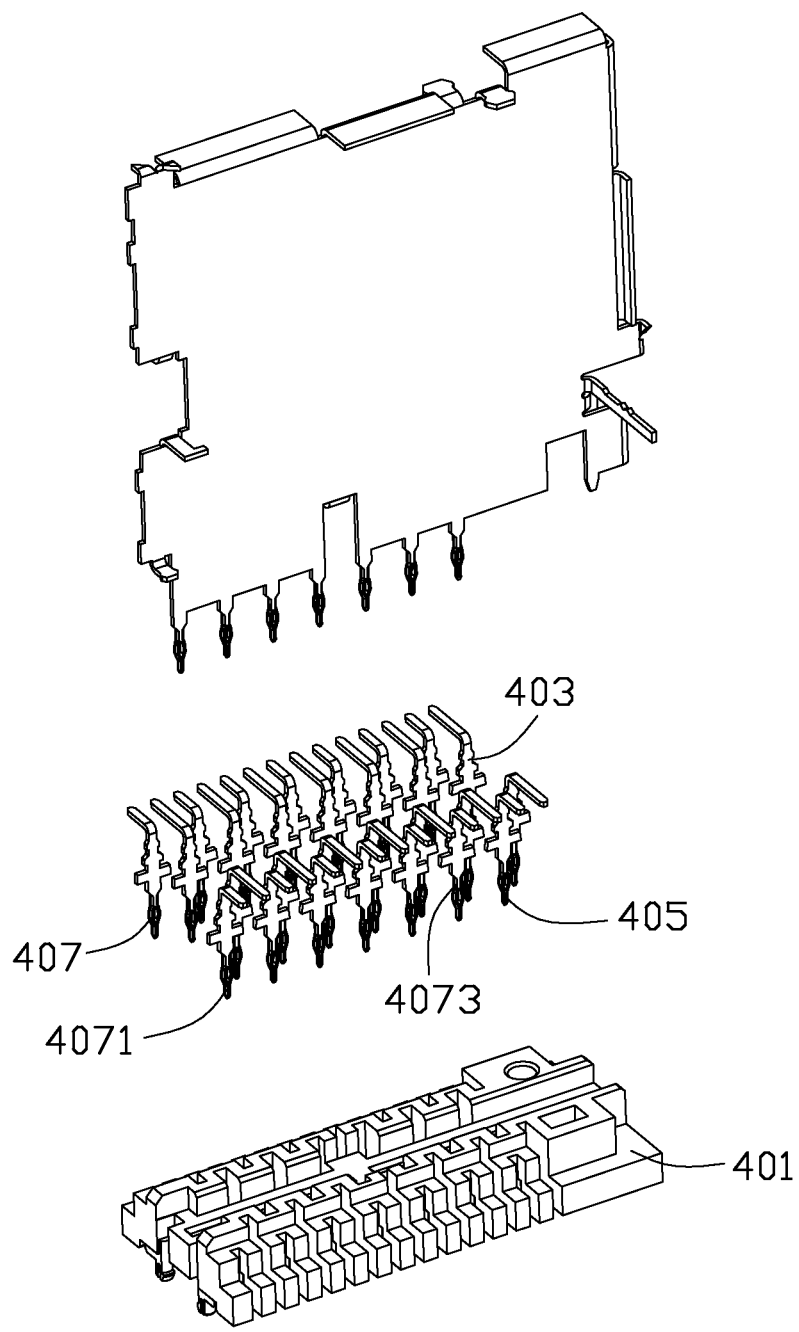
FIG. 6 is a partly exploded view of the contact module as shown in FIG. 5.

Reference will now be made in detail to the preferred embodiment of the present invention.

Referring to FIGS. 1 to 8, there is shown a 2×8-port electrical connector or modular jack 10 adapted for being mounted onto a printed circuit board (not shown) defining a plurality of vias (not shown). The electrical connector 10 has a row of upper ports 21 and a row of lower ports 22 vertically stacked in columns. Both of the upper and lower ports 21, 22 are used to receive a modular plug (not shown) with a high speed up to 10 Gigabit/second. One modular plug inserts into either the upper or the lower port 21 or 22 along an insertion direction. The electrical connector 10 includes an insulative housing 200, a plurality of contact modules 400 received in the insulative housing 200, a plurality of sub-circuit boards 600 used for reducing signal interference and a shielding shell 500 enclosing the insulative housing 200. The contact module 400 further comprises contacts, inner printed circuit board, electrical elements for signal conditioning such as capacitance, magnetic components, etc. known to those skilled in this art but omitted herein for ease of description and clarity.

Referring to FIGS. 1 to 4, the insulative housing 200 has a mounting surface 12 facing the printed circuit board. The upper and the lower ports 21, 22 comprise a front surface disposed as a mating surface 24 and is vertical to the mounting surface 12. The insulative housing 10 further includes a plurality of projection portions 14 for projecting from the mounting surface 12 toward the printed circuit board.

Figure 7:
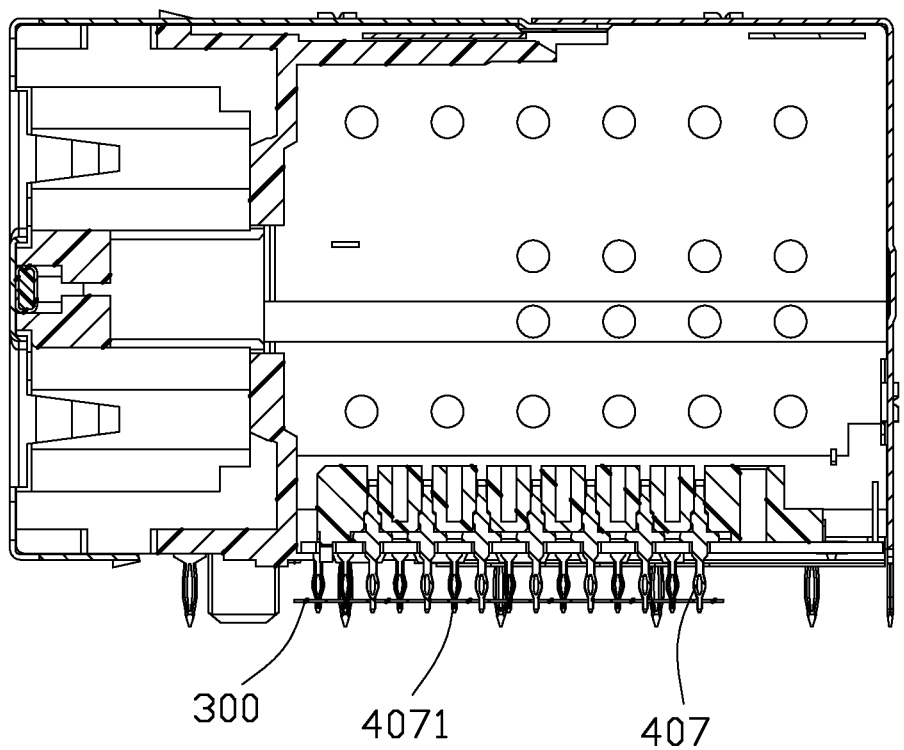
FIG. 7 is a cross-sectional view of the electrical connector taken along line 7-7 in FIG. 1 before the electrical connector is mounted to a printed circuit board.

Referring to FIGS. 1 to 8, the contact module 400 includes a position member 401 and a plurality of conductive terminals 403 mounted on the position member 401. Each of the conductive terminals 403 as a press-fit or compliant pin, includes a pin end 405 extending beyond the position member 401 for passing through one of the vias of the printed circuit board. Each of the pin ends 405 includes a needle eye portion 407 which has an interference with the via. The needle eye portion 407 includes a first end 4071 and a second end 4073. A distance between the first end 4071 and the printed circuit board is shorter than a distance between the second end 4073 and the printed circuit board before the electrical connector 10 is mounted to the printed circuit board as shown in FIG. 7.

The electrical connector 10 further includes a position fixer 300 which is preferably made by plastic material. The position fixer 300 has a plurality of through holes 301 each retaining to a corresponding pin end 405. When the electrical connector 10 is mounted to the printed circuit board, the position fixer 300 is moved up to the mounting surface 12. The position fixer 300 is parallel to the printed circuit board. The pin ends 405 are inserted into the through holes 301 of the position fixer 300, respectively. The diameter of the needle eye portion 407 is bigger than the diameter of the through hole 301 of the position fixer 300, while the diameter of the through hole 407 is smaller than the via of the printed circuit board. And it is contribute to enhance the position performance. Besides, the electrical connector 10 has a plurality of vertical ground plates 101 disposed between every two adjacent contact modules 400 to obviate electromagnetic interference.

Figure 8:
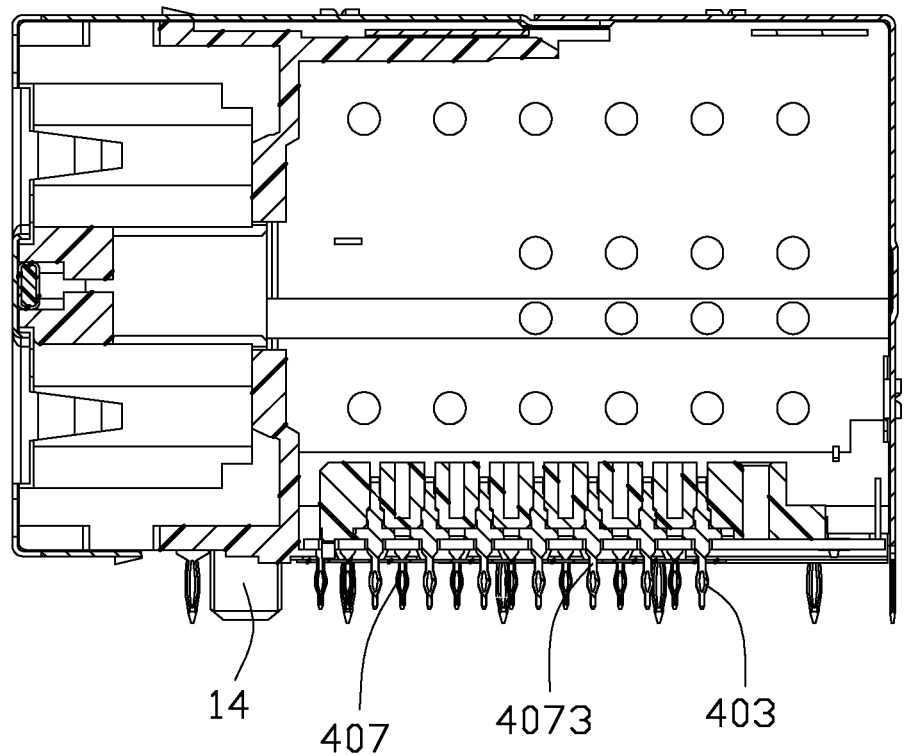
FIG. 8 is a cross-sectional view taken along line 7-7 in FIG. 1 after the electrical connector has been mounted to the printed circuit board.

Referring to FIGS. 7 to 8, the position fixer 300 is mounted to the first end 4071 of the pin end 405 before the electrical connector 10 is assembled to the printed circuit board. The position fixer 300 is moved to the second end 4073 of the pin end 405 after the electrical connector 10 is assembled to the printed circuit board. With the position fixer 300 in place before mounting the connector to the printed circuit board, exposed portions of the conductive terminals 403 are relatively shorter and therefore are less likely subject to bending by external forces. As can be understood, bent terminal or terminals cause difficulty in subsequent insertion into the via.

The plurality of sub-circuit boards 600 are mounted on the bottom end of the insulative housing 200. Each the sub-circuit board 600 has a plurality of the openings 601 to receive the conductive terminals 403, respectively. In this embodiment, the plurality of sub-circuit boards 600 are divided into four groups, every two contact modules 400 share a sub-circuit board 600.

The shielding shell 500 includes a front shell 501 and a rear shell 503 assembled to the front shell 501. The shielding shell 500 includes a front wall 502, a top wall 504, a rear wall 505, two side walls 506, and a plurality of ground tails 507. The shielding shell 500 has a plurality of inserting openings 508 positioned at the top and rear walls 504, 505, respectively. The top wall 504 consists of a top wall of the front shell 501 and a top wall of the rear shell 503 assembled with each other and the rear shell 503 is assembled to the front shell 501 along a back-to-front direction. Each side wall 506 is constituted by a front portion of the rear shell 505 and a rear portion of the front shell 502.

Referring to FIGS. 1 to 8, a method of mounting an electrical connector 10 having a housing 200 and a plurality of conductive terminals 403 to a printed circuit board (not shown) having a plurality of vias, the method comprising the steps of:

retaining a position fixer 300 defining a plurality of through holes 301 corresponding to the conductive terminals 403 to pin ends 405 of the conductive terminals 403; and inserting the pin ends 405 into the vias while moving the position fixer 300 all the way up to the housing 200.

As described above, the pin end 405 may include a needle eye portion 407. The following steps of retaining comprise placing the position fixer 300 onto the needle eye portions 407. Firstly, the pin ends 405 are inserted through corresponding through holes 301 of the position fixer 300, respectively. The position fixer 300 is disposed at the first end 4071 adjacent to free ends of the pin ends 405. Then, the electrical connector 10 is mounted to the printed circuit board, the position fixer 300 pressed from the first end 4071 through the needle eye portions 407 to the second end 4073.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the members in which the appended claims are expressed.

What is claimed is:

1. An electrical connector adapted for being mounted onto a printed circuit board defining a plurality of vias, the electrical connector comprising:
    an insulative housing having a mounting surface adapted for being mounted onto the printed circuit board;
    a contact module assembled to the insulative housing, said contact module comprising a plurality of conductive terminals, each of the conductive terminals comprising a pin end extending beyond the mounting surface for being inserted into one of the vias;
    a position fixer having a plurality of through holes each retaining to a corresponding pin end prior to the position fixer being moved up to the mounting surface when the electrical connector is mounted to the printed circuit board.

2. The electrical connector as claimed in claim 1, wherein said pin end comprises a needle eye portion having a first end and a second end, and the position fixer, prior to the electrical connector being mounted onto the printed circuit board, is disposed adjacent to the first end while, after the electrical connector being pressed into the printed circuit board, the position fixer is moved to the second end.

3. The electrical connector as claimed in claim 2, wherein a diameter of the needle eye portion is greater than a diameter of the through hole of the position fixer.

4. The electrical connector as claimed in claim 1, wherein there are provided plural contact modules assembled to the insulative housing, and said insulative housing defines a plurality of ports forwardly opening to receive a plurality of mating connectors, respectively.

5. The electrical connector as claimed in claim 1, wherein said position fixer is parallel to the printed circuit board.

6. The electrical connector as claimed in claim 1, wherein said pin ends extend along a direction perpendicular to the position fixer.

7. The electrical connector as claimed in claim 1, wherein said insulative housing comprises a projection portion for aligning to the printed circuit board.

8. The electrical connector as claimed in claim 1, further comprising a sub-circuit board at the mounting surface of the insulative housing.

9. The electrical connector as claimed in claim 1, further comprising a shielding shell enclosing the insulative housing, the shielding shell having a plurality of ground tails.

10. A method of mounting an electrical connector having a housing and a plurality of conductive terminals to a printed circuit board having a plurality of vias, the method comprising the steps of:
   retaining a position fixer defining a plurality of through holes corresponding to the conductive terminals to pin ends of the conductive terminals; and
   inserting the pin ends into the vias while moving the position fixer all the way up to the housing.

11. The method of assembling an electrical connector as claimed in claim 10, further comprising a step of providing a needle eye portion to the pin end, and wherein the step of retaining comprises placing the position fixer onto the needle eye portion.

12. An electrical connector for mating with at least a complementary connector and for mounting to a printed circuit board, comprising:
   an insulative housing defining a mating face for mating with said at least complementary connector, and a mounting face for mounting to the printed circuit board;
   a plurality of contact modules dispose in the housing around the mounting face, said contact module including a position member associated with a plurality of conductive terminals, each of said terminal defining a press-fit mounting portion for mounting to a corresponding hole in the printed circuit board, said press-fit mounting portion including an upper needle eye section and a lower pin type section wherein said upper needle eye section is transversely shrinkable and defines a larger width than the lower pin type section; and
   a position fixer characterized with deformability thereof; wherein
   the housing and the contact modules are configured to allow the lower pin type sections of said press-fit mounting portions to pierce through said positioning fixer and retained thereto in a snug manner when said position fixer is located in a lower position before said connector is mounted to the printed circuit board, and to allow the upper needle eye sections of said mounting portions to further pierce through said position fixer via a procedure of mounting said connector to the printed circuit board to have the upper needle eye sections further inserted into said corresponding holes in the printed circuit board when said position fixer is located in a final position.

13. The electrical connector as claimed in claim 12, wherein said position fixer is moved above the needle eye section when the position fixer is located in the final position.

14. The electrical connector as claimed in claim 12, wherein said position member is wholly located around said mounting face and equipped with two rows of said terminals arranged in a minor image with a shielding plate therebetween.

15. The electrical connector as claimed in claim 12, wherein the shielding plate defines a height similar to that of the housing while the position member is less than a half of that of the housing.

16. The electrical connector as claimed in claim 12, wherein a sub-circuit board is mounted between the contact module and the position fixer and pierced by the mounting portion.

\* \* \* \* \*